(12) United States Patent
Sanada (10) Patent No.: US 7,384,458 B2
(45) Date of Patent: Jun. 10, 2008

(54) NON-CYANIDE ELECTROLESS GOLD PLATING SOLUTION AND PROCESS FOR ELECTROLESS GOLD PLATING

(75) Inventor: Masaki Sanada, Nagano (JP)

(73) Assignee: Shinko Electric Industries Co., Ltd., Nagano-shi (JP)

(*) Notice: Subject to any disclaimer, the term of this patent is extended or adjusted under 35 U.S.C. 154(b) by 0 days.

(21) Appl. No.: 11/686,087

(22) Filed: Mar. 14, 2007

(65) Prior Publication Data

US 2007/0218212 A1    Sep. 20, 2007

(30) Foreign Application Priority Data

Mar. 20, 2006  (JP) .............................. 2006-077687

(51) Int. Cl.
    C23C 18/44    (2006.01)
    B05D 1/18     (2006.01)

(52) U.S. Cl. .................. 106/1.23; 106/1.26; 427/437; 427/443.1

(58) Field of Classification Search ............. 106/1.23, 106/1.26; 427/443.1, 437
    See application file for complete search history.

(56) References Cited

U.S. PATENT DOCUMENTS

| | | | | |
|---|---|---|---|---|
| 5,252,196 A * | 10/1993 | Sonnenberg et al. | ........ | 205/296 |
| 6,165,342 A * | 12/2000 | Kuhn et al. | ................. | 205/247 |
| 6,235,093 B1 * | 5/2001 | Okuhama et al. | .......... | 106/1.18 |
| 6,652,731 B2 * | 11/2003 | Cobley et al. | .............. | 205/296 |
| 6,755,957 B2 * | 6/2004 | Nakamura et al. | .......... | 205/123 |
| 7,264,848 B2 * | 9/2007 | Sanada et al. | ........... | 427/443.1 |
| 2005/0092616 A1 * | 5/2005 | Hu et al. | ..................... | 205/266 |
| 2005/0111162 A1 * | 5/2005 | Osaka et al. | ................ | 361/271 |
| 2006/0012044 A1 * | 1/2006 | Knop et al. | ................. | 257/750 |
| 2006/0062927 A1 | 3/2006 | Sanada et al. | | |
| 2007/0071888 A1 * | 3/2007 | Shanmugasundram et al. | ......................... | 427/97.7 |
| 2007/0099422 A1 * | 5/2007 | Wijekoon et al. | ........... | 438/687 |

* cited by examiner

*Primary Examiner*—Helene Klemanski
(74) *Attorney, Agent, or Firm*—Rankin, Hill & Clark LLP (57) ABSTRACT

The non-cyanide electroless gold plating solution according to the invention is a non-cyanide electroless gold plating solution free from a cyanide compound, wherein bis-(3-sulfopropyl)disulfide is added, as a complexing agent for gold stabilization, to the electroless gold plating solution.

6 Claims, 6 Drawing Sheets

SOLUTION STABILITY: NO SOLUTION DECOMPOSITION IS OBSERVED EVEN AFTER PASSAGE OF 30 DAYS WHILE MAINTAINING AT 90°C A SODIUM SULFITE SOLUTION (COMPARATIVE EXAMPLE 1) IS DECOMPOSED WITHIN 2 HOURS

SOLUTION STABILITY: NO SOLUTION DECOMPOSITION IS OBSERVED EVEN AFTER PASSAGE OF 30 DAYS WHILE MAINTAINING AT 90°C A SODIUM SULFITE SOLUTION (COMPARATIVE EXAMPLE 1) IS DECOMPOSED WITHIN 2 HOURS

FIG. 3  EXAMPLE   SPS

FIG. 4  COMPARATIVE EXAMPLE 2   MES

EROSION

FIG. 5  COMPARATIVE EXAMPLE 3   CYANIDE

EROSION

NON-CYANIDE ELECTROLESS GOLD PLATING SOLUTION AND PROCESS FOR ELECTROLESS GOLD PLATING

BACKGROUND OF THE INVENTION

The present invention relates to a non-cyanide electroless gold plating solution and a process for electroless gold plating.

Figure 1:
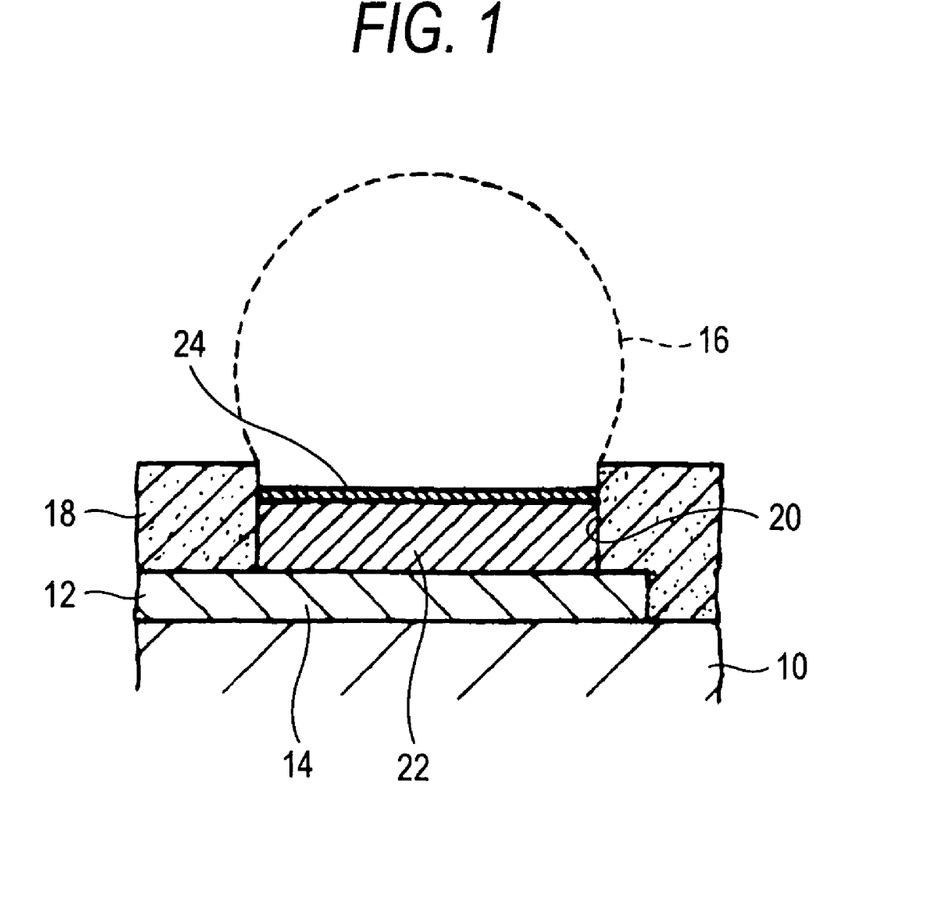
FIG. 1 is an explanatory drawing illustrating the portion of a substrate to be subjected to electroless gold plating.

The process for producing a semiconductor device includes a step mounting a solder ball 16 as an external connecting terminal on a pad 14 constituting an end part of a wiring pattern 12 made of copper and formed on one surface of a substrate 10, as shown in FIG. 1.

At the formation of such a solder ball 16 on the pad 14 made of copper, a resinous mask layer 18 such as a solder resist is first formed on one surface of the substrate 10 and then a concave portion 20 where a pad surface is exposed at the bottom is formed in the mask layer 18 by laser or the like.

Then, in the concave portion 20, after a metal layer 22 made of Ni—P is formed as an underlying layer by electroless nickel plating, the substrate 10 is dipped in an electroless gold plating solution in order to form a gold layer 24 thinner than the metal layer 22 on the upper surface of the metal layer 22 by immersion gold plating.

Thereafter, by placing a solder ball on the gold layer 24 and reflowing it, gold is diffused into the solder and an alloy of Ni—P of the metal layer 22 with the solder is formed, thereby firmly fixing the solder ball 16 as an external connecting terminal.

As the electroless gold plating solution in which the substrate 10 is dipped at the time of immersion gold plating for forming the gold layer, there has been hitherto employed a cyanide-containing electroless gold plating solution to which a cyanide complex such as $KAu(CN)_2$ is added as a gold source.

However, since the cyanide-containing electroless gold plating solution is generally used in an alkaline region, the resinous mask layer 18 such as a solder resist is apt to be eroded when the substrate 10, one surface of which is covered with the mask layer 18, is dipped in the cyanide-containing electroless gold plating solution.

Moreover, with regard to the cyanide-containing electroless gold plating solution, special care should be taken in its handling owing to its toxicity and also a special operation is necessary for detoxifying it in the case of its disposal.

Furthermore, the cyanide-containing electroless gold plating solution has a problem that a reaction with the underlying Ni—P metal layer 22 (displacement reaction) is apt to proceed excessively and pinholes remain in the underlying Ni—P metal layer, that is, Ni erosion generates.

Instead of such a conventional cyanide-containing electroless gold plating solution, a non-cyanide electroless gold plating solution free from a cyanide compound has been proposed in Hyomen Gijutsu (Surface Finishing), vol. 52, No. 5, 2001 (pages 410 to 413), for example.

In such a non-cyanide electroless gold plating solution, a gold sulfite complex is added as a gold source in order to stabilize a gold ion in the electroless gold plating solution.

However, since such a non-cyanide electroless gold plating solution is still used in an alkaline region, the resinous mask layer 18 such as a solder resist is apt to be eroded when the substrate 10, one surface of which is covered with the mask layer 18, is dipped in the non-cyanide electroless gold plating solution.

Furthermore, the non-cyanide electroless gold plating solution containing a gold sulfite complex as a gold source is extremely low in stability as described in Hyomen Gijutsu (Surface Finishing), vol. 46, No. 9, 1995 (pages 775-777). Therefore, frequency of replacement of the electroless gold plating solution increases.

In order to solve the problems of the non-cyanide electroless gold plating solution, there has been reported a cyanide-containing electroless gold plating solution to which sodium mercaptoethanesulfonate (MES) is added (Patent Document 1).

According to the non-cyanide electroless gold plating solution, since it is possible to use it in a region of pH 7 or lower, there are advantages that a resinous mask layer such as a solder resist is not eroded and also solution stability is satisfactory.

[Patent Document 1] US 2006/0062927 A1

However, with regard to the above non-cyanide electroless gold plating solution to which MES is added, no problem arises in the case that the underlying metal layer is a so-called low-phosphorus type Ni—P plated metal layer of a phosphorus content of about 1 to 4% by weight. But, in the case that a so-called medium-phosphorus type plated metal layer of a phosphorus content of about 6 to 9% by weight, there is a problem that the underlying metal layer is eroded and roughened by the non-cyanide electroless gold plating solution. Therefore, there is a problem that satisfactory bonding reliability of solder cannot be attained.

SUMMARY OF THE INVENTION

Accordingly, an object of the invention is to provide a non-cyanide electroless gold plating solution, which not only is capable of being used in an acidic region and excellent in stability but also do not roughen the underlying layer even when the underlying layer is made of a medium-phosphorus type Ni—P plated metal layer. Another object of the invention is to provide a process for electroless gold plating using the non-cyanide electroless gold plating solution.

The present inventors have extensively studied considering that, for solving the above problems, it is important to select a complexing agent of gold, which combines with a gold ion to form a strong gold complex in an electroless gold plating solution. As a result, the inventors have found that a non-cyanide electroless gold plating solution to which bis-(3-sulfopropyl)disulfide is added as a complexing agent for gold stabilization exhibits a sufficient stability and can be used in an acidic region and also the underlying Ni—P metal layer is not eroded, thus arriving at the invention.

Namely, according to the invention, there is provided a non-cyanide electroless gold plating solution free from a cyanide compound, including: bis-(3-sulfopropyl)disulfide as a complexing agent for gold stabilization.

The electroless gold plating solution may have a pH value of 7 or lower and erosion of the resinous mask layer such as a solder resist can be prevented even when the substrate, one surface of which is covered with the mask layer, is dipped in the non-cyanide electroless gold plating solution.

Furthermore, the deposition rate of gold can be enhanced by adding thallium (Tl) as an accelerator of deposition rate to the electroless gold plating solution.

Besides, as a source of gold, a gold sulfite salt or a chloroaurate salt can be preferably used.

Further, there is provided a process for electroless gold plating including: a step of forming a gold layer, by electroless gold plating, on a metal surface exposed at a bottom surface of a concave portion that is opened in a resinous mask layer covering one surface of a substrate, wherein the above non-cyanide electroless gold plating solution is used as a non-cyanide electroless gold plating solution for dipping the substrate.

In this invention, even when an underlying metal layer is a medium-phosphorus type Ni—P plated metal layer having a phosphorus content in the plated film of 6 to 9% by weight, the metal layer is not eroded by the non-cyanide electroless gold plating solution according to the invention during plating and bond reliability of the solder ball bonded on the formed gold layer can be improved.

Since the complexing agent for gold stabilization to be used in the electroless gold plating solution according to the invention forms a complex with gold as stable as a cyanide complex such as MES, the stability of the non-cyanide electroless gold plating solution according to the invention is satisfactory.

Furthermore, the electroless gold plating solution according to the invention can be used in an acidic region. Therefore, even when a substrate, one surface of which is covered with a resinous mask layer such as a solder resist, is dipped in the non-cyanide electroless gold plating solution according to the invention, the erosion of the mask layer can be prevented.

Moreover, with regard to the non-cyanide electroless gold plating solution according to the invention, even when the underlying metal layer is a medium-phosphorus type Ni—P plated metal layer having a phosphorus content in the plated film of 6 to 9% by weight, the metal layer is not eroded by the non-cyanide electroless gold plating solution according to the invention during plating and bond reliability of the solder ball bonded on the formed gold layer can be improved.

DETAILED DESCRIPTION OF THE PREFERRED EMBODIMENTS

The non-cyanide electroless gold plating solution according to the invention is characterized in that bis-(3-sulfopropyl)disulfide (SPS) is added as a complexing agent for gold stabilization.

Moreover, as a complexing agent for gold stabilization, it is possible to use a compound represented by the following formula:

$$X_1-(CH_2)_n-S-S-(CH_2)_{n'}-X_2 \qquad \text{[Chem 1]}$$

wherein n, n'=2 or 3 and $X_1$, $X_2$=$SO_3H$ or $NH_2$ which includes bis-(3-sulfopropyl)disulfide.

The amount of the complexing agent for gold stabilization to be added is an amount sufficient to complex gold and the mole number of the complexing agent is roughly equivalent to 1~10 times bigger than that of gold.

Moreover, as a gold source to be used in combination with the complexing agent for gold stabilization to be added in the invention, a gold sulfite salt or a chloroaurate salt can be suitably used. The amount of the gold source to be added is preferably from about 0.5 to 3 g/L as gold metal.

Figure 2:
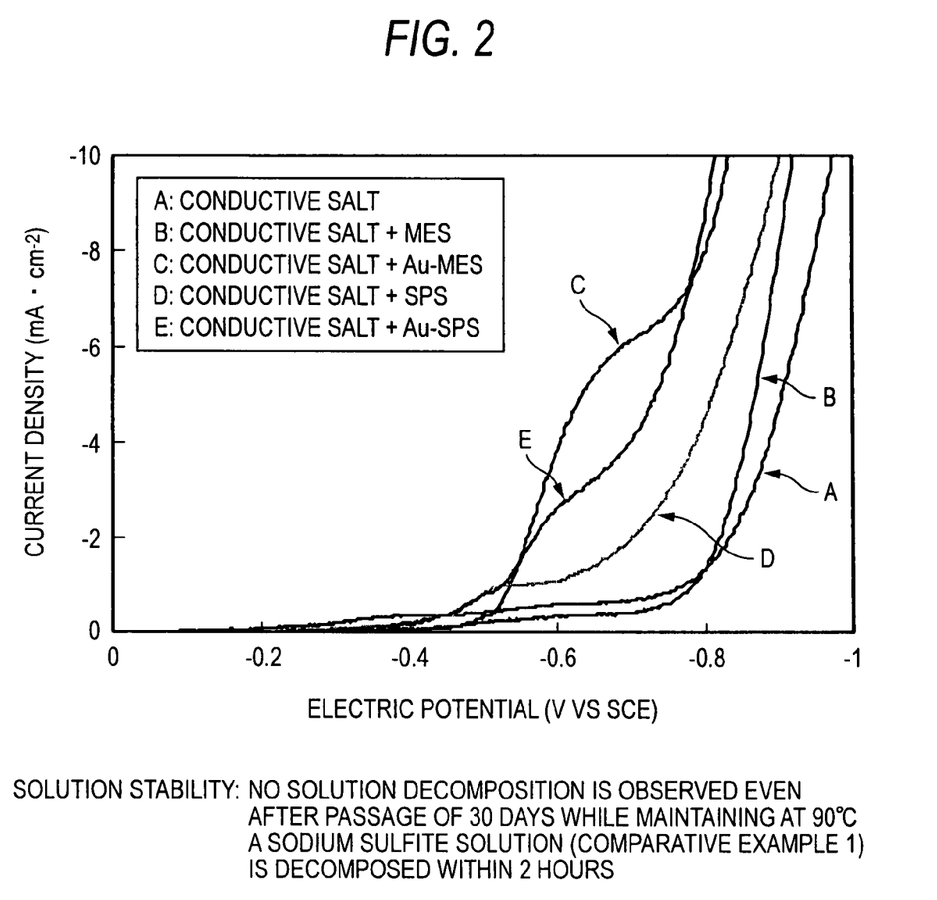
FIG. 2 is a graph illustrating hydrogen generation potential of each of a solution to which a conductive salt is added, a solution to which the conductive salt and MES are added, and a solution to which the conductive salt and SPS are added and gold deposition potential of each of a solution of the complex of the conductive salt and an Au-MES complex and a solution of the complex of the conductive salt and an Au-SPS complex.

The gold complex formed in the non-cyanide electroless gold plating solution comprising a gold sulfite salt and bis-(3-sulfopropyl)disulfide exhibits reduction potential close to that of the gold complex formed in the non-cyanide electroless gold plating solution comprising a gold sulfite salt and sodium mercaptoethanesulfonate (MES) and a stable gold complex can be formed.

This fact is shown in FIG. 2. In FIG. 2, Curve A shows reduction potential of a conductive salt (a citric acid solution to which gold is not added) alone (hydrogen generation), Curve B shows reduction potential of a solution to which the conductive salt and MES are added (hydrogen generation), Curve C shows reduction potential of a solution to which the conductive salt and an Au-MES complex (a complex made of Au and MES) are added (gold deposition), Curve D shows reduction potential of a solution to which the conductive salt and SPS are added (hydrogen generation), and Curve E shows reduction potential of a solution to which the conductive salt and an Au-SPS complex (a complex made of Au and SPS) are added (gold deposition). The potential of gold deposition from the Au-SPS complex (Curve E) is more negative than the potential of gold deposition from the Au-MES complex (Curve C) and thus stability of the former plating solution is higher. The non-cyanide electroless gold plating solution to which SPS is added is not decomposed even after the passage of 30 days while maintaining at 90° C. and thus has a sufficient stability. On the other hand, in the sodium sulfite electroless gold plating solution containing no complexing agent (Comparative Example 1), deposition of gold in the solution is observed within 2 hours of maintenance at 90° C. (Table 1).

The measurement of the above reduction potential is conducted using a platinum rotating electrode having subjected to electrolytic gold plating as a working electrode and using a platinum plate as a counter electrode, the platinum rotating electrode being rotated at 1000 rpm. As is apparent from FIG. 2, the potential of gold deposition shown by Curve E extremely resembles the potential of gold deposition shown by Curve C.

In this connection, the reduction potential shown in FIG. 2 is measured with adjusting the pH value of the solution to 5.

To the non-cyanide electroless gold plating solution according to the invention, a conductive salt which may be added to a conventional electroless gold plating solution, e.g., a citrate salt such as potassium citrate monobasic or potassium citrate monohydrate can be added, and a pH adjuster such as potassium hydroxide can be added.

The non-cyanide electroless gold plating solution according to the invention is preferably adjusted with a pH adjuster to an acidic region of a pH value of 7 or lower, more preferably a pH value of 6 or lower, particularly preferably an acidic region of a pH value of 6 to 3. With the non-cyanide electroless gold plating solution according to the invention adjusted to an acidic region condition as above, even when the substrate 10, one surface of which is covered with the resinous mask layer 18 such as a solder resist, is dipped therein, the mask layer 18 can be prevented from erosion.

Furthermore, by adding thallium (Tl) as an accelerator of deposition rate to the non-cyanide electroless gold plating solution according to the invention, the deposition rate of gold can be improved. Thallium (Tl) can be added in the form of thallium sulfate or thallium acetate.

The amount of thallium (Tl) to be added is preferably from 0.1 to 100 ppm.

Using the non-cyanide electroless gold plating solution according to the invention mentioned above, a gold layer 24 is formed, by immersion gold plating, on an exposed surface of a metal layer 22 serving as an underlying layer and made of Ni—P which is exposed at the bottom surface of a concave portion 20 that is opened in the mask layer 18 covering one surface of the substrate 10 as shown in FIG. 1.

At that time, the metal layer 22 serving as an underlying layer and made of Ni—P, which is exposed at the bottom surface of the concave portion 20 of the substrate 10, can be formed by first subjecting the exposed surface of a pad 14 exposed at the bottom surface of the concave portion 20 opened in the mask layer 18 covering one surface of the substrate 10 as shown in FIG. 1 to pre-treatment wherein a catalyst metal such as Pd is deposited, and subsequently dipping the thus-pretreated substrate 10 for a predetermined period of time in an electroless nickel plating solution.

Then, the resulting substrate 10, in which the metal layer 22 serving as an underlying layer and made of Ni—P is formed on the exposed bottom surface of the concave portion 20, is dipped in the non-cyanide electroless gold plating solution according to the invention for a predetermined period of time, thereby the gold layer 24 can be formed on the exposed surface of the metal layer 22.

In the immersion gold plating, it is preferred to maintain the non-cyanide electroless gold plating solution at 40 to 90° C. while adjusting its pH value to an acidic region, i.e., a pH value of 7 or lower, more preferably a pH value of 6 or lower, particularly preferably a pH value of 6 to 3.

After the substrate 10 is thus dipped in the non-cyanide electroless gold plating solution according to the invention for a predetermined period of time, the substrate 10 is taken out of the electroless gold plating solution, washed, and dried.

In the resulting substrate 10, the mask layer 18 is tightly adhered onto one surface of the substrate 10 and a glossy and dense gold layer 24 is formed on the bottom surface of the concave portion 20.

In the case of the non-cyanide electroless gold plating solution in the present embodiment using SPS as a complexing agent, as mentioned above, not only the solution stability is excellent but also attack to the underlying Ni—P plated metal layer in the displacement reaction is extremely slow, so that the underlying Ni—P plated metal layer is not roughened (FIG. 3) and hence a soldering property with a solder ball is satisfactory. In any case that the underlying Ni—P plated metal layer is a so-called low-phosphorus type Ni—P plated metal layer having a phosphorus content of about 1 to 4% by weight or a so-called medium-phosphorus type Ni—P plated metal layer having a phosphorus content of about 6 to 9% by weight, its plated film is not roughened.

Figure 5:
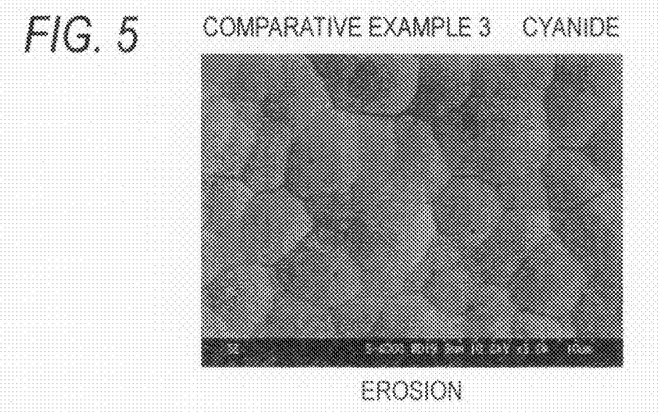
FIG. 5 is a photograph of the surface of a metal layer made of medium-phosphorus type Ni—P, after forming a gold layer thereon using a cyanide-containing electroless gold plating solution according to Comparative Example 3 and then stripping the gold layer.

On the other hand, in the case of the conventional cyanide electroless gold plating solution, the displacement reaction with the underlying Ni—P plated metal layer vigorously occurs as mentioned above and, in the underlying Ni—P plated metal layer, pinholes and deep grooves in grain boundary parts are formed and thus the metal layer is severely roughened (FIG. 5).

Figure 4:
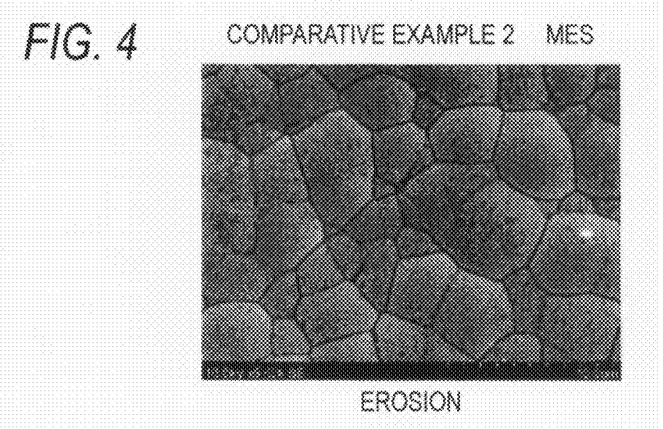
FIG. 4 is a photograph of the surface of a metal layer made of medium-phosphorus type Ni—P, after forming a gold layer thereon using a non-cyanide electroless gold plating solution according to Comparative Example 2 and then stripping the gold layer.

Moreover, in the case of the non-cyanide electroless gold plating solution in the present embodiment using MES as a complexing agent, the underlying Ni—P plated metal layer is not roughened in the case that the underlying Ni—P plated metal layer is a low-phosphorus type one but pinholes and roughing are generated in the case that the underlying Ni—P plated metal layer is a medium-phosphorus type one (FIG. 4).

According to the process for electroless gold plating according to the invention, on the metal layer 22 made of Ni—P and formed using the electroless nickel plating solution on the bottom part of the concave portion 20 of the substrate 10 shown in FIG. 1, a gold layer 24 is formed using the non-cyanide electroless gold plating solution according to the invention. Then, on the gold layer 24, a solder piece is mounted and reflowed to be able to form a solder ball 16 as an external connecting terminal.

The bonding strength of the formed solder ball 16 is satisfactory as compared with the case that the gold layer 24 is formed using a cyanide-containing electroless gold plating solution or a conventional non-cyanide electroless gold plating solution using MES as a complexing agent.

EXAMPLES (1) Preparation of Object to be Plated

An exposed surface of a copper wiring pattern 12 exposed at the bottom surface of a concave portion 20 opened in a mask layer 18 which covers one surface of the substrate 10 as shown in FIG. 1 is subjected to pre-treatment so as to deposit Pd as a catalyst metal. Thereafter, the substrate 10 is dipped in an electroless nickel plating solution to form a metal layer 22 made of Ni—P and having a thickness of 5 μm. As the electroless nickel plating solution for forming the metal layer 22, a medium-phosphorus type electroless nickel plating solution having a phosphorus content of 6 to 9% by weight is used.

(2) Preparation of Electroless Gold Plating Solution

As electroless gold plating solutions, the electroless gold plating solutions shown in Table 1 below are prepared.

TABLE 1

|  |  | Example | Comparative Example 1 | Comparative Example 2 | Comparative Example 3 |
|---|---|---|---|---|---|
| Gold source | Sodium gold sulfite | *1 g/l | Same as in the left | Same as in the left | Described in Table 2 |
| Complexing agent | SPS | 4.5 g/l | — | — |  |
|  | MES | — | — | 4.5 g/l |  |
| Conductive salt and Complexing agent | Potassium citrate monobasic | 70 g/l | Same as in the left | Same as in the left |  |
|  | Potassium citrate monohydrate | 20 g/l | Same as in the left | Same as in the left |  |
| Accelerator of deposition rate | Thallium sulfate | **10 mg/l | Same as in the left | Same as in the left |  |
| pH adjuster | Potassium hydroxide | Optional | Same as in the left | Same as in the left |  |
| pH |  |  |  | 4.5 |  |
| Bath temperature |  |  |  | 75° C. |  |
| Solution stability |  | ⊚ | X | ⊚ | ⊚ |

*Amount as gold metal
**Amount as thallium metal
Solution stability
⊚: no solution decomposition is observed after maintenance at 90° C. for 30 days
X: solution decomposition is observed within 2 hours after maintenance at 90° C.

TABLE 2

| Triammonium citrate | 20 g/l |
|---|---|
| Diammonium ethylenediaminetetraacetate | 25 g/l |
| Potassium aurous cyanide | 5 g/l |
| pH | 6.5 |
| Bath temperature | 80° C. |

(3) Electroless Gold Plating

The prepared object to be plated is dipped in the solutions shown in Table 1 to form a gold layer 24 having a thickness of 0.06 μm on the Ni—P layer 22.

Figure 3:
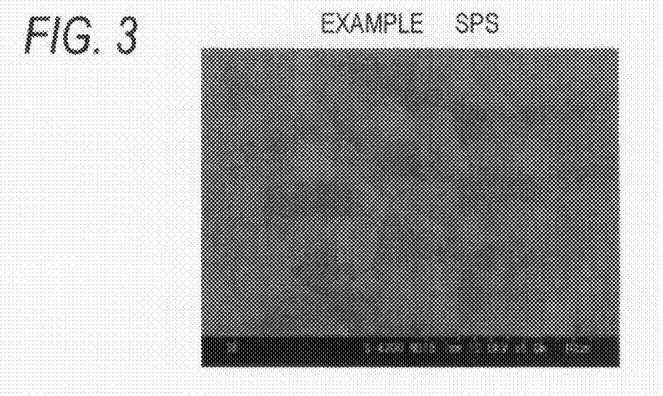
FIG. 3 is a photograph of the surface of a metal layer made of medium-phosphorus type Ni—P, after forming a gold layer thereon using a non-cyanide electroless gold plating solution according to the invention and then stripping the gold layer.

Then, after the gold layer 24 is stripped using a commercially available gold strip solution, results obtained by observing the surface of the metal layer 22 on electron microscopic photographs are shown in FIG. 3, FIG. 4, and FIG. 5.

As shown in FIG. 3, in the case of the present Example using SPS as a complexing agent, no roughening is observed on the surface of the Ni—P plated metal layer 22.

On the other hand, as shown in FIG. 4, in the case of Comparative Example 2 using MES as a complexing agent, deep grooves are formed along the grain boundary of the Ni—P plated metal layer and a large number of pinholes are generated, the surface being remarkably roughened.

Moreover, as shown in FIG. 5, in the case of cyanide-based electroless gold plating solution, it is found that slightly deep grooves are formed along the grain boundary of the Ni—P plated metal layer and large pinholes are generated.

(4) Bond Reliability of Soldering

Solder balls 16 are formed on the gold layers 24 of Example, Comparative Example 2, and Comparative Example 3 by placing a solder piece thereon and reflowing it. Each of the solder balls 16 is subjected to a ball pull test to measure the situation in which the solder ball 16 is broken by a tensile force and also measure the breaking strength. The results are shown in FIG. 6 and FIG. 7.

Figure 7:
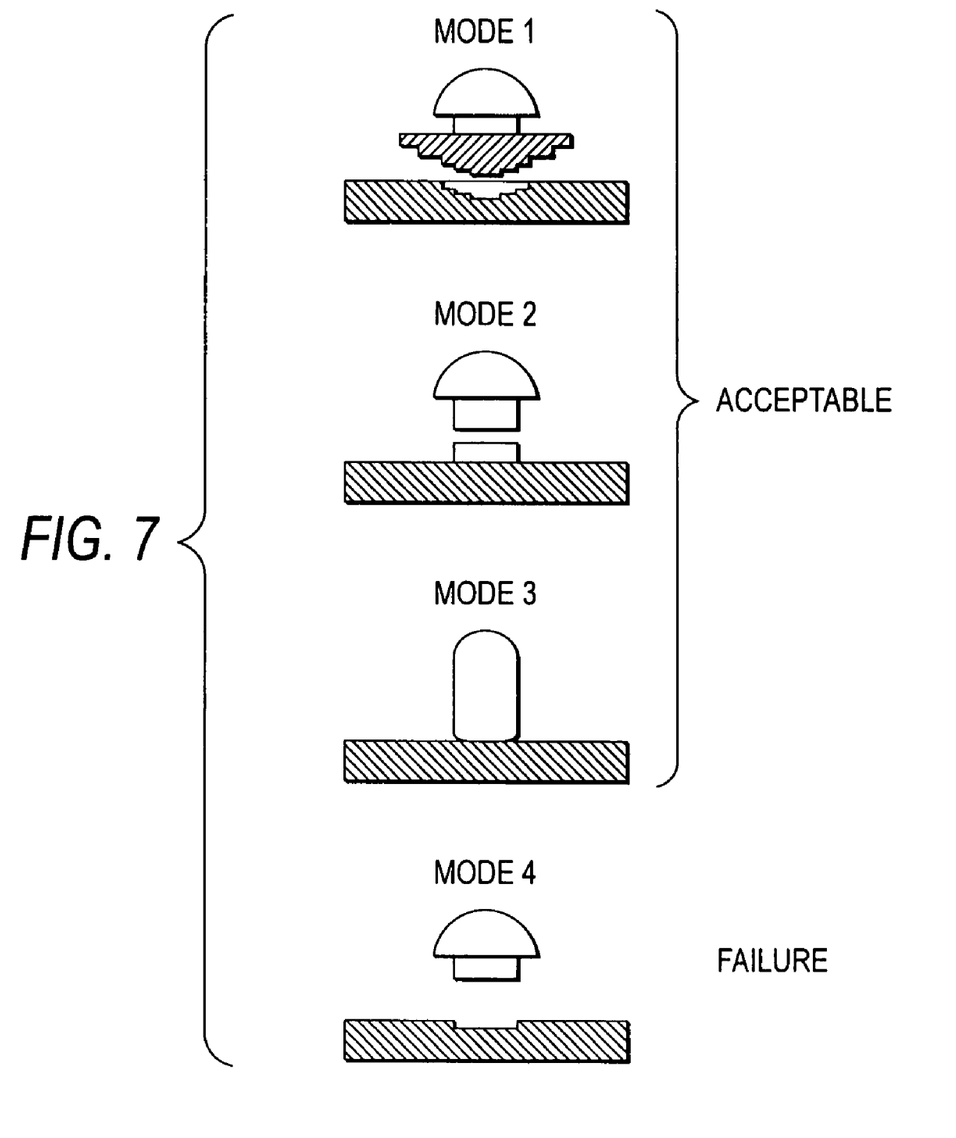
FIG. 7 is an explanatory drawing illustrating a broken mode of a solder ball when a tensile force is applied to the solder ball formed on a gold layer formed by electroless gold plating.

First, the situation in which the solder ball 16 is broken by a tensile force is classified into Mode 1 to Mode 4 as shown in FIG. 7. The broken situations of Mode 1 to Mode 3 are attributable to the breakage of the solder ball 16 itself or the breakage of the metal layer 22 on which the solder ball is mounted and thus are not attributed to the peeling between the solder ball 16 and the metal layer 22. Therefore, these modes are rated as acceptable (OK).

On the other hand, the broken situation of Mode 4 corresponded to the breakage attributable to peeling between the solder ball 16 and the metal layer 22, so that this mode is rated as failure (NG).

Figure 6:
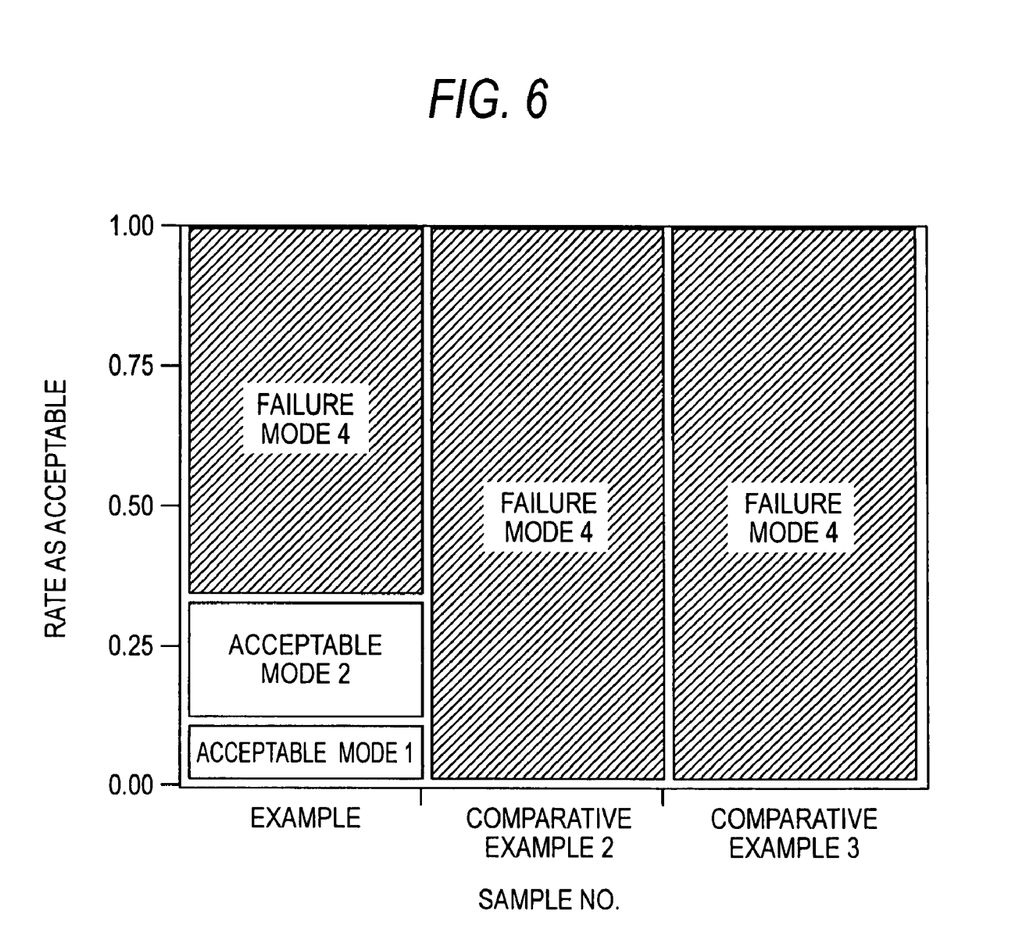
FIG. 6 is an explanatory drawing illustrating results of the ball pull test when a tensile force is applied to a solder ball formed on the gold layer formed by electroless gold plating in Example, Comparative Example 2, and Comparative Example 3.

With regard to the situation in which the solder ball 16 is broken by such a tensile force, as shown in FIG. 6, the rate where the broken situations are rated as acceptable (OK) is about 30% for Example, whereas all the samples are rated as unacceptable (NG) for Comparative Example 2 and Comparative Example 3.

Incidentally, the ball pull test is a relative strength test wherein the solder ball 16 is formed under the same condition by reflowing a solder under relatively severe conditions (long period of time, high temperature) and then a breaking test is performed with the same tensile strength and thus is not absolute evaluation. Since diffusion of nickel into the solder is facilitated by using severer reflow conditions (higher temperature, longer period of time), bonding strength of the solder is lowered. Even when the breaking test is performed under such conditions, the rate where the broken situations are rated as acceptable (OK) is about 30% in the case of Example and thus it is realized that the bond strength of the solder is remarkably excellent as compared with the cases of Comparative Examples 2 and 3 where the rate as acceptable is zero (solutions of Comparative Examples 2 and 3 are not necessarily defective ones as products).

Figure 8:
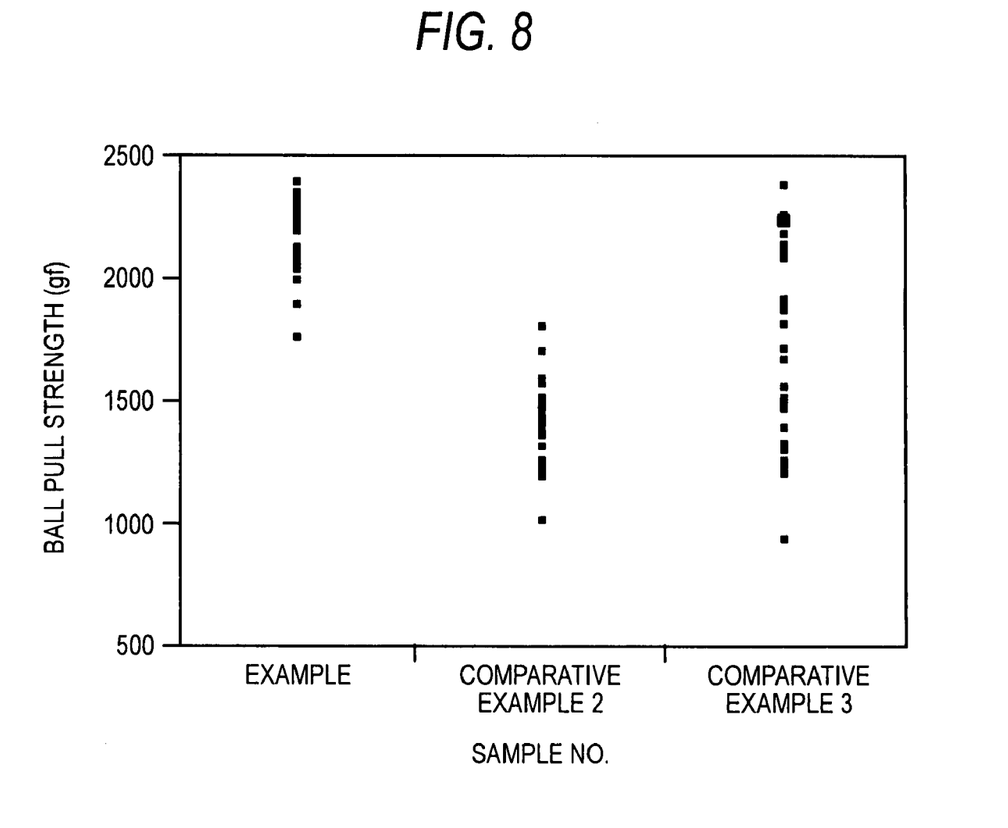
FIG. 8 is a graph illustrating breaking strength (ball pull strength) at which the solder ball is broken when a tensile force is applied to the solder ball formed on a gold layer formed by electroless gold plating.

Moreover, FIG. 8 shows the results of measurement on data dispersion of breaking strength (ball pull strength) at which the solder ball 16 is broken. As shown in FIG. 8, the ball pull strength of the case of Example is also high in its average value and the data dispersion is also small, as compared with the cases of Comparative Examples 2 and 3.

What is claimed is:

1. A non-cyanide electroless gold plating solution free from a cyanide compound, comprising:
    bis-(3-sulfopropyl)disulfide as a complexing agent for gold stabilization.

2. The non-cyanide electroless gold plating solution according to claim 1, wherein
    a pH value is 7 or lower.

3. The non-cyanide electroless gold plating solution according to claim 1, further comprising:
    thallium (Tl) as an accelerator of deposition rate.

4. The non-cyanide electroless gold plating solution according to claim 1, wherein
    a gold source is a gold sulfite salt or a chloroaurate salt.

5. A process for electroless gold plating, comprising:
    a step of forming a gold layer, by electroless gold plating, on a metal surface exposed at a bottom surface of a concave portion that is opened in a resinous mask layer covering one surface of a substrate, wherein
    the non-cyanide electroless gold plating solution according to any one of claims 1 to 4 is used as a non-cyanide electroless gold plating solution for dipping the substrate.

6. The process for electroless gold plating according to claim 5, wherein
    an underlying metal layer whose metal surface is exposed at a bottom surface of a concave portion of the substrate is a medium-phosphorus type Ni—P plated metal layer having a phosphorus content in the plated film of 6 to 9% by weight.

* * * * *